(12) United States Patent
Grasset et al.

(10) Patent No.: US 7,988,059 B2
(45) Date of Patent: Aug. 2, 2011

(54) METHOD FOR CONNECTING AN ELECTRONIC CHIP TO A RADIOFREQUENCY IDENTIFICATION DEVICE

(75) Inventors: Yannick Grasset, Vallauris (FR);
Nicolas Pangaud, Lonay (CH);
Christophe Halope, Cannes (FR)

(73) Assignee: ASK S.A., Sophia Antipolis (FR)

( * ) Notice: Subject to any disclaimer, the term of this patent is extended or adjusted under 35 U.S.C. 154(b) by 601 days.

(21) Appl. No.: 12/138,796

(22) Filed: Jun. 13, 2008

(65) Prior Publication Data

US 2009/0014527 A1    Jan. 15, 2009

(30) Foreign Application Priority Data

Jun. 15, 2007    (FR) ...................................... 07 04293

(51) Int. Cl.
*G06K 19/06* (2006.01)
(52) U.S. Cl. ....................................................... 235/492
(58) Field of Classification Search .................. 235/488, 235/492; 340/572.1; 438/107
See application file for complete search history.

(56) References Cited

U.S. PATENT DOCUMENTS

| 6,786,419 | B2 * | 9/2004 | Kayanakis | 235/492 |
| 6,910,636 | B2 * | 6/2005 | Kim et al. | 235/492 |
| 7,102,520 | B2 * | 9/2006 | Liu et al. | 340/572.1 |
| 7,597,266 | B2 * | 10/2009 | Benato | 235/492 |
| 2005/0148112 | A1 | 7/2005 | Weekamp et al. | 438/107 |

FOREIGN PATENT DOCUMENTS

| DE | 100 64 411 | 6/2002 |
| DE | 101 33 588 | 9/2002 |
| WO | WO 2006/009934 | 1/2006 |

* cited by examiner

*Primary Examiner* — Seung H Lee
(74) *Attorney, Agent, or Firm* — James C. Lydon

(57) ABSTRACT

A method for connecting an electronic chip (10) to contacts (47 and 48) of an electric circuit, the chip having two conductive plates (31 and 32) located on the last layer of the chip and at least one electromagnetic shielding layer, at least one of the plates (31 or 32) being entirely covered with an electrical insulating layer (34). The method includes placing an adhesive dielectric material (40) on the circuit between the contacts (47, 48), to fix the electronic chip (10) relative to the circuit, positioning electronic chip (10) on the circuit so that conductive plates (31 et 32) are opposite the contacts (47 and 48), so as to create between the chip and the electric circuit at least one capacitive link made up of the conductive plate (31 or 32), the electrically insulating layer and the contact (47 or 48).

13 Claims, 3 Drawing Sheets

METHOD FOR CONNECTING AN ELECTRONIC CHIP TO A RADIOFREQUENCY IDENTIFICATION DEVICE

This invention concerns the means of connecting integrated circuits to electric circuits and concerns particularly a method for connecting an electronic chip to a radiofrequency identification device.

In the field of semi-conductors, the integrated circuits or very small electronic chips are widely used in many areas including smart cards, radiofrequency identification labels and cards commonly referred to as the RFID field. In order to be connected to electric circuits, the integrated circuits have several means of contact capable of being connected to the group of contacts of the circuit, their number varying according to the application. In the RFID field, the number of contacts of the integrated circuit varies generally between 2, 3 and 4.

The manufacturing process of a semi-conductor is based on the use of a complex photographic method to create the mask of each layer. Depending on the complexity of the integrated circuit, there can be up to 20 to 30 layers. Metallization levels, used to lay down aluminum or copper, are placed on the last layers. The last metallization level located on the periphery of the integrated circuit on the last layer making up the chip is created during the last manufacturing steps of the integrated circuit and features conductive plates. These conductive plates will then be used to receive the means of contact that will be used to connect the integrated circuit to its destination electric circuit. The last manufacturing step of the integrated circuit is the creation of a passivating layer on the face of the integrated circuit where the conductive plates are flush. This passivating layer consists of a layer of insulating material of constant thickness of a few microns and featuring openings located opposite the conductive plates so as to enable ohmic contact of almost zero electrical resistance with the connection means.

One of the techniques used to make the electrical connections between the electronic chip and the circuit in which it is inserted consists in using wire bonding. With reference to FIG. 1, the wiring is simply done by wires (or bonds) 14 welded between the two contacts designed to this end on each of the elements to be connected together. The aluminum, gold or copper wires are generally welded by ultrasonic welding. The diameter of the wire is in the order of 25 µm (micrometers). In order to protect the wires, the chip 10 is generally encased in a box 16, active face up. The wires are wired on conductive plates 12 flush with the active face of the chip 10. The second end of wires is connected to stiff connecting tabs 18 integral with box 16 and designed to be welded to the destination circuit. In this manner, the means of contact between the chip and the contacts of the destination circuit include wire conductive contacts between the conductive plates located on the last metallization level of the chip and the stiff tabs 18 of the box 16 on the one hand, and welds between the stiff tabs 18 and contacts of the destination circuit on the other hand. This means of contact has the advantage of providing large sizes with respect to the chip owing to tabs 18 and the box 16. The box 16, generally made of plastic material, provides significant additional thermal inertia and enables to limit temperature variations of the chip. The drawback of such an installation resides in the fact that it is expensive. Furthermore, its thickness is large because of the connecting wires, box and tabs. In this manner, the size of such an installation makes it unsuitable for smart cards, radiofrequency identification labels and cards that have a thickness of less than 1 mm. Finally, the size of wires requires high precision during installation, in the order of a few tens of micrometers.

A second way to install integrated circuits or electronic chips is based on another assembly technique in which the chip is turned over, this is the "Flip Chip" technique. This technique is characterized by a direct connection of the chip's active face on the destination electric circuit, unlike the "Wire Bonding" type wiring technique and is shown in cross-section in FIG. 2. This technique consists in placing a ball of conductive material 20 commonly referred to as "bump", usually made of gold, on each of the conductive plates 12 of the chip 10 in the openings of an electrically insulating layer 34 that represents the passivating layer located on the active face of the chip. The chip is then connected by its active face to the destination electric circuit 22 through the contact of balls of conductive material on the group of contacts 24 of the electric circuit; the group of contacts being placed so as to reproduce the location of balls of conductive material. For such an installation technique, the means of contact between the chip and the contacts of the destination circuit consists of a ball of conductive material in contact between the two parts. The disadvantage of such an installation resides in the accuracy of positioning, the size of balls of conductive material and that of conductive plates being in the order of 100 µm, this makes the installation tricky. Furthermore, the step that consists in placing balls of conductive material represents a significant cost in the fabrication process of integrated circuits or electronic chips.

The two traditional installation techniques used for the connection of electronic chips and described previously consist thus in creating an ohmic link and require the addition of conductive material for the contact between the chip and the electric circuit on which it is inserted.

This is why the object of the invention is to provide a method for installing the chip on an electric circuit that do not require means of contact added to the chip to create the connection between the chip and the electric circuit.

The object of the invention is thus a method for connecting an electronic chip to contacts of an electric circuit designed to receive the chip, the chip being provided with two conductive plates located on the last layer making up the chip and at least one electromagnetic shielding layer, at least one of the plates being entirely covered by an electrically insulating layer, the method including the following steps:
  Placing adhesive dielectric material on the circuit between the contacts, so as to maintain the electronic chip in a fixed position relative to the circuit,
  Positioning the electronic chip on the circuit so that the conductive plates are opposite the contacts of the electric circuit, so as to create between the chip and the electric circuit at least one capacitive link made up of the conductive plate, the electrically insulating layer completely covering the plate and the contact.

The purposes, objects and characteristics of the invention will become more apparent from the following description when taken in conjunction with the accompanying drawings in which.

Figure 1:
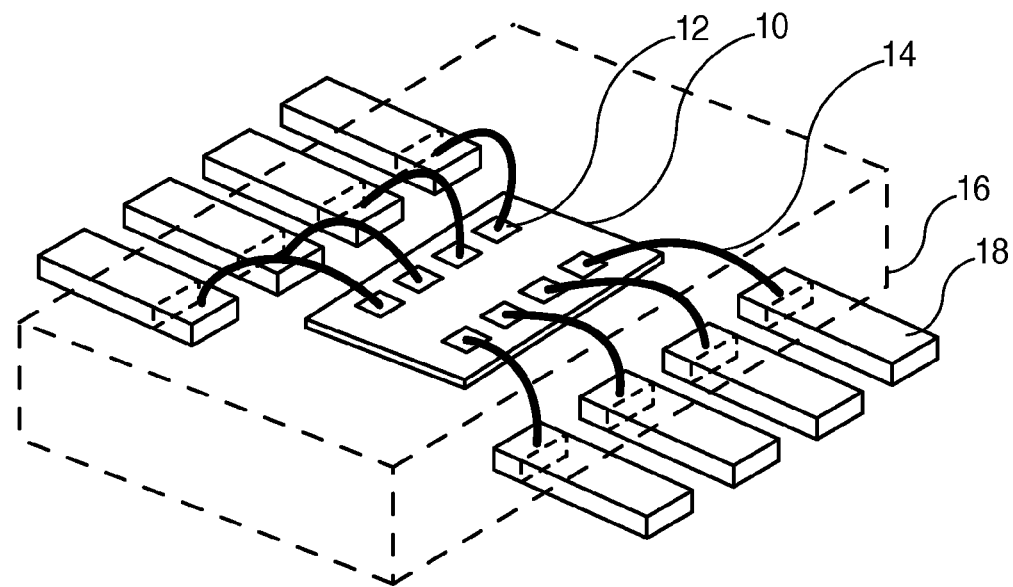
FIG. 1 represents an installation technique for chips using conductive wires.
Figure 2:
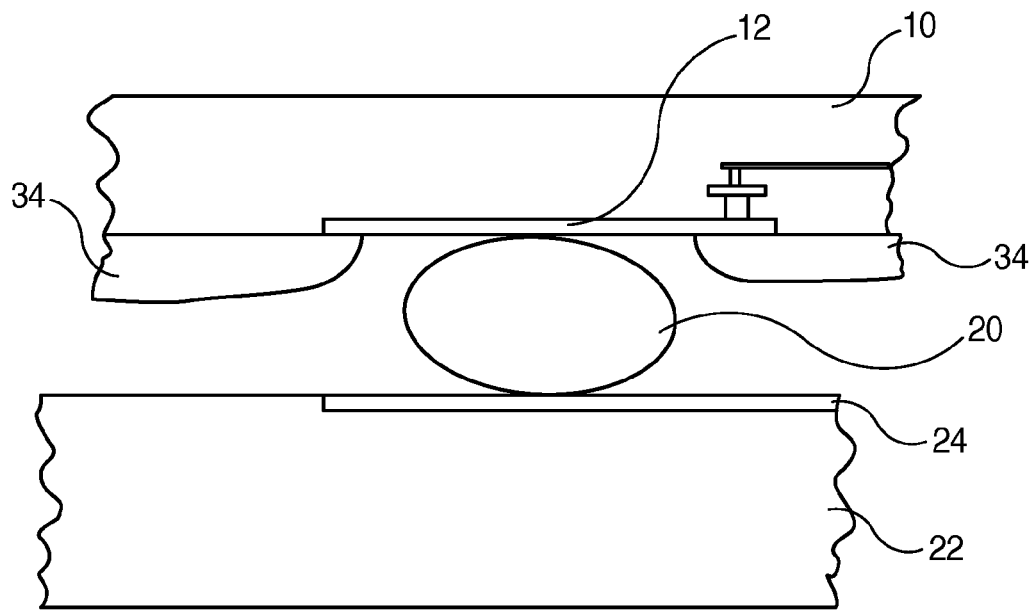
FIG. 2 represents an installation technique for chips using "bumps"
Figure 3:
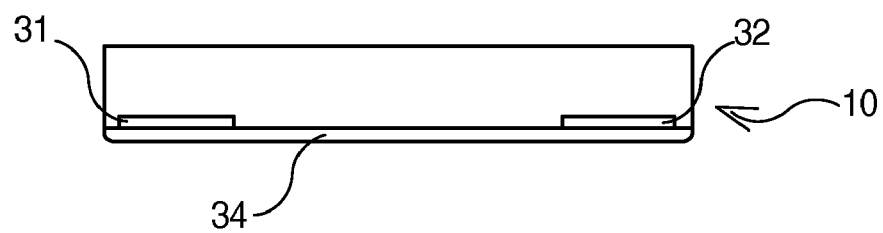
Figure 4:
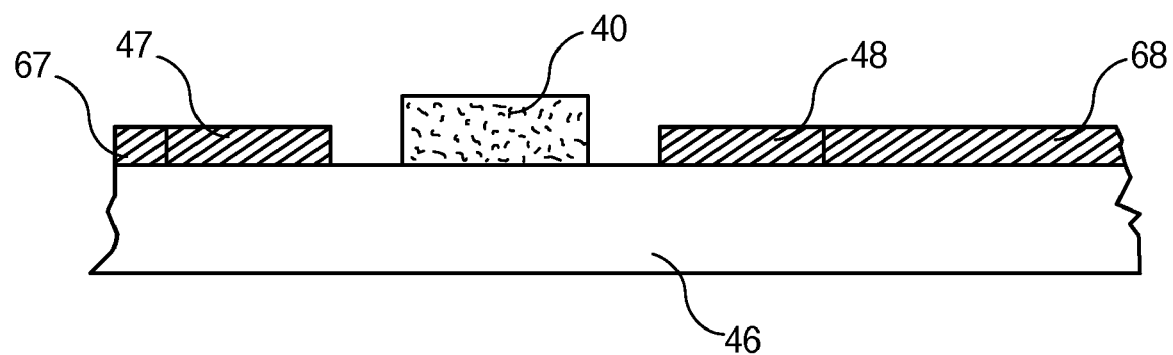
Figure 5:
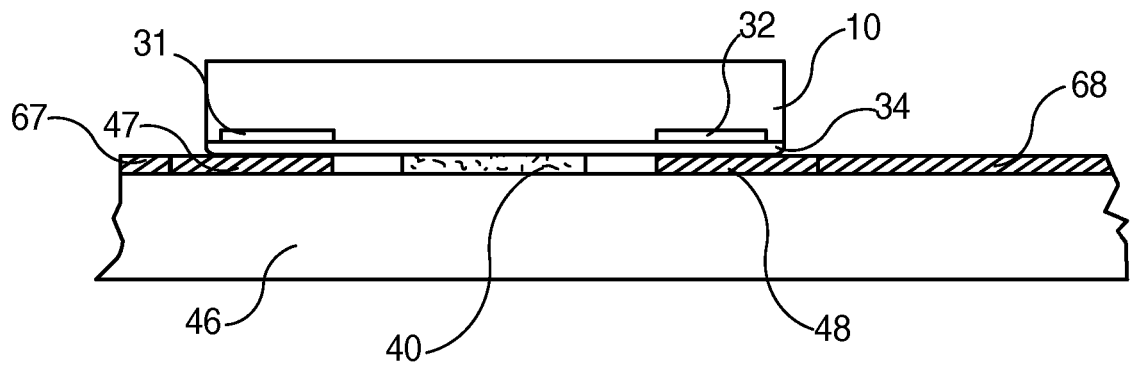
Figure 6:
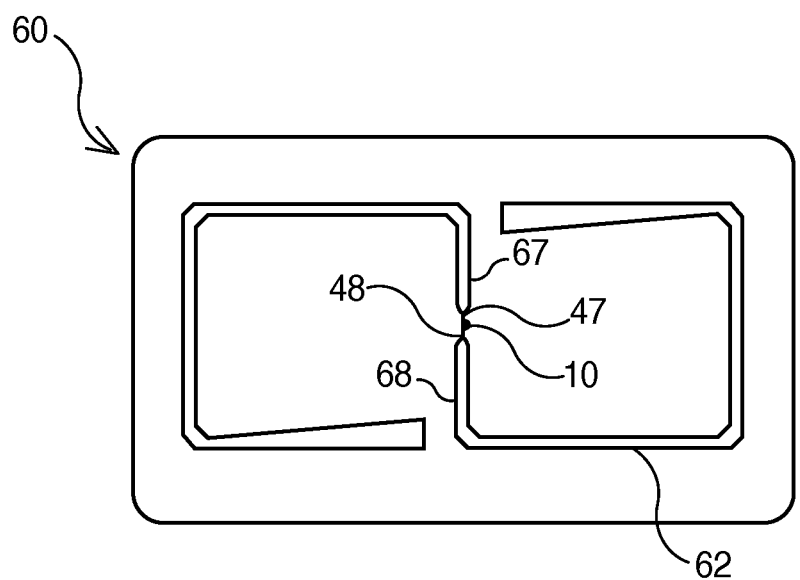

FIG. 3 represents a cross sectional view of the chip according to the invention, FIG. 4 represents a cross sectional view of the electric circuit support after depositing the dielectric material, FIG. 5 represents a cross sectional view of the electric circuit support after the chip positioning step, FIG. 6 represents a contactless portable object seen from top to which is connected a chip according to the invention.

According to FIG. 3, which represents a cross-section, the chip or the integrated circuit 10 features two metal plates 31 and 32 corresponding to metallization made at the last level of the chip. In the installation techniques using conductive wires or balls of conductive material, these metal plates represent the groups of contacts to which the means of contact are connected in order to create an ohmic link between the chip and the electrical circuit on which it is installed. Within the scope of the invention, at least one of the metal plates is of a size larger than those used for connecting integrated circuits by traditional methods, thus by ohmic contact. The preferred embodiment of the invention describes two identical metal plates designed to create two connections according to the invention. In this case, for a chip of size 1 mm×0.6 mm, the size of each metal plate is in the order of 200 μm×500 μm. Furthermore, the electrically insulating passivating layer that is created last on the active face of the chip, i.e. the face featuring the metal plates, does not include any opening unlike the electronic chips adapted to be connected by ohmic type means of contact. The electrically insulating layer 34 is made on the entire active surface of the chip to form an insulating layer of uniform thickness generally less than 3 μm.

According to FIG. 4, the support 46 on which the chip is connected is shown in cross-section. It may be a support of flexible material such as a paper support on which is printed an antenna by screen printing, flexography, rotogravure, offset or ink jet. Or else, it may be any electrical circuit such as an electronic card, for example. The antenna represented by the two trace parts 67 and 68 features two contacts 47 and 48 also made in the same way as the antenna and extending from the latter in order to connect the chip and the antenna. The conductive ink used is preferably a polymer ink loaded with conductive elements such as silver, copper and carbon. An adhesive dielectric material 40 is placed on the support 46, between the two contacts 47 and 48. This adhesive material is applied before the chip is placed on the support.

Once the adhesive material is applied, the chip is positioned on the support 46 so that the metal plates 31 and 32 of the chip are opposite the contacts 47 and 48 of the antenna. It does not matter whether the ink forming the contacts 47 and 48 is dry or wet. A pressure is exerted on the chip. As a result of the pressure, the adhesive dielectric material 40 spreads and covers the entire surface of the chip between the contacts 47 and 48. It thus enables to hold the assembly of the chip 10 on the support 46 and particularly to maintain the chip 10 in a fixed position on the support. A capacitive link is thus created between the metal plate 31 and the contact 47. Similarly, a capacitive link is thus created between the metal plate 32 and the contact 48. The value of the capacitance obtained is proportional to the surface area of the plates facing one another and to the value of the permittivity of the insulating layer that separates them and inversely proportional to the thickness of this insulating layer. Permittivity is expressed in Farads per meter (F/m). It can also be expressed by a dimensionless quantity: the relative permittivity or dielectric constant, standardized with respect to the permittivity of vacuum $\epsilon_0$ (Epsilon0)=8.854187×10−12 F/m. The permittivity of the material is then equal to $\epsilon=\epsilon_0 * \epsilon_R$ (Epsilon=Epsilon0*Epsilon R) Whatever the thickness of the electrically insulating layer known as the passivating layer, the common relative permittivity value is in the order of 4 for materials used in the manufacture of chips. In general, the thickness of the electrically insulating layer is in the order of 3 μm.

FIG. 6 shows a front view of a contactless portable object 60 such as a smart card or a ticket. The antenna 62 features conductive traces 67 and 68 ending by two connection pads, similar to two contacts 47 and 48 described previously. The chip 10 is connected to the antenna according to the method of the invention.

Each connection formed by a metal plate, an insulating layer and a contact forms a capacitor. As a result, a capacitor or a capacitance being made up of two conductive plates separated by an electrical insulator, the capacitive link represented by the connection made according to the invention method is constituted for one of the conductive plates by a contact or conductive plates 31 or 32 within the electronic chip itself 10, for the insulator by the electrically insulating layer or passivating layer of the electronic chip and for the second conductive plate by contacts 47 and 48 of the electric circuit and designed to receive the chip. The value of the capacitance required will depend on the impedance of the circuit to be connected at the desired operating frequency, in order to create the optimum impedance of the chip for its adaptation (commonly referred to as "matching network") to the impedance of the antenna.

The purpose of the invention is preferably suited to frequency ranges from Ultra High Frequencies (UHF) in the order of one GHz and particularly greater than 860 MHz (frequency of 1 GHz according to the ISO 18000-6 standard and frequency of 2.45 GHz according to the ISO 18000-4 standard). Actually, the chips used for such frequencies have a complex input impedance in the order of Z=20−j*100 Ohms, which corresponds for example to an electric circuit containing a resistance and a capacitor in series, thus an RC circuit that has a capacitance value in the order of 800 fF.

When the chip is built into an electric circuit and the signals exchanged between the chip and the circuit are high frequency signals, it is always necessary to create an element or an adaptation network added at the output of the chip or otherwise. This adaptation enables to optimize the transfer of power of the signal exchanged or to optimize the performance in terms of noise i.e. to reduce random and unwanted signals overlapping the useful signals. The adaptation is done by means of a network of components such as capacitance or inductance. The device according to the invention enables to add to the RC model of the chip a capacitance in series that plays the role of the adaptation element so as to enable optimum adaptation between the chip and the electrical network to which it is connected. In the case of RFID devices, the network connected to the chip is an antenna. The value of the capacitance of the capacitive link created between the chip and the antenna as defined by the invention is taken into account in the adaptation of the antenna to the chip and thus enables to optimize this adaptation.

Thus, to adapt the input impedance of the chip to the impedance of the circuit and for example for an imaginary portion with input impedance of the chip corresponding to 800 fF (femto Farad), a dielectric of thickness e=3 μm and corresponding to the insulating layer of relative permittivity $\epsilon R$ (Epsilon R) in the order of 4, we deduce the required surface area of the opposing connecting plates according to the formula $C=\epsilon_0 * \epsilon R * S/e$ (C=Epsilon 0*Epsilon R*S/e). The required surface area is in the order of 6.8 10−6 m2, which corresponds, for example, to a surface area of 200 μm×340 μm. To implement the invention with RFID chips in the UHF frequency range, i.e. frequencies in the order of giga Hertz, conductive plates will have to be provided with a surface area of at least 200 µm×340 µm. For an imaginary portion of the input impedance of the chip greater than 800 fF, conductive plates of surface area less than 200 µm×340 µm may be provided for. The capacitive link made according to the method of the invention thus contributes to the adjustment of the adaptation of the chip and the circuit where it is inserted, thus in our case the adjustment of the adaptation of the chip to the antenna and even represents an essential element of the adaptation network.

When dealing with an RFID label type contactless portable object operating at Ultra High Frequencies, the capacitive link then created between the chip and the antenna and as defined by the invention is also taken into account in the tuning of the antenna to the chip. Actually, the antenna must be tuned to the operating frequency of the reader.

The method according to the invention has the advantage of making the installation of the chip on contacts of the destination circuit easier. Actually, the size of metal plates being very big compared to the size of the chip, the accuracy of the installation according to the method of the invention is much lower than that required for the installation of chips according to the "flip chip" type assembly technique as described previously and in which the connection is made by means of chip bumps having a diameter less than 100 µm. In this manner, with a chip that has a rectangular active face and in which the metal plates are located along the small sides of the rectangle symmetrically with respect to the axis of symmetry parallel to the small sides of the rectangle, the positioning of the chip will be possible just by identifying the large side and the small side of the chip's active face. In this manner, during installation of the chip on the destination electric circuit, the rectangular shape of the active face and the symmetrical layout of conductive plates enable to do away with the orientation of the chip along the larger side as both orientations are possible. Furthermore, owing to the large size of conductive plates, this enables to increase the tolerances when installing the chip. In this manner, the time saved on the identification phase of the chip bumps and the widening of installation tolerances enables to increase the work rate for the installation of chips on circuits designed to receive them and thus to reduce production costs.

In addition, owing to the fact that the layer of insulating material completely covers the active face of the chip, the metal plates are protected against pollution, diffusion, migration and other electrical phenomena likely to affect the quality and functionality of the electronic chip.

The production of the chip or integrated circuit is based on the use of a complex photographic method to create the various layers containing all of the circuits. The various layers making up the chip 10 are manufactured in such a way that the part within the thickness of the chip located opposite the conductive plates 31 and 32 situated at the periphery of the chip contains as few metal connections as possible to form the integrated circuit. By placing the chip horizontal, this part corresponds to the part of the chip situated above the conductive plates 31 and 32. Furthermore, the chip can also contain, on one or more levels, one or more additional metal layers in order to minimize the parasite capacitance between the plates 31 and 32 of the capacitor and all metal connections directly opposite. This (or these) layer(s) play(s) the role of a shield or electromagnetic screen against radiation emitted by the chip connections that, on the scale of the chip, create parasite capacitance harmful to the capacitive link created between the conductive plates 31 and 32 and contacts 47 and 48. The presence of such a parasite capacitance tends to reduce the capacitance value of the capacitive link created between the chip and the antenna and could also reduce it to the point of making the electrical connection between the chip and the antenna insufficient. The presence of this (or these) additional electromagnetic shielding layer(s) is therefore very important. This shielding is therefore preferably located between the conductive plates and the chip connections so as to reduce as much as possible the parasite capacitance that could appear between the conductive plates and the chip connections and to optimize the capacitance value of the capacitive link.

The invention claimed is:

1. A method for connecting an electronic chip to contacts of an electric circuit designed to receive said chip, said chip being provided with two conductive plates located on the last layer making up the chip and at least one electromagnetic shielding layer, at least one of the plates being entirely covered by an electrically insulating layer, said method comprising the following steps:
   placing adhesive dielectric material on said circuit between the contacts so as to maintain said electronic chip in a fixed position relative to the circuit;
   positioning the electronic chip on said circuit so that said conductive plates are opposite the contacts of the electric circuit;
   thereby creating at least one capacitive link between said chip and the electric circuit, the electrically insulating layer completely covering said plate and the contact.

2. The method of claim 1, wherein said electric circuit is a radiofrequency identification device comprising an antenna placed on a support, said antenna comprising two contacts.

3. The method of claim 2, wherein said antenna is obtained by printing conductive ink on said support.

4. The method of claim 3, wherein the size of said conductive plate forming a capacitive link with the electric circuit is in the order of 200 µm by 500 µm.

5. The method of claim 3, wherein said conductive plates are situated symmetrically on said chip with respect to the axis of symmetry parallel to the small side of said chip's active face when the latter is rectangular.

6. The method of claim 3, wherein said support is made of fibrous material.

7. The method of claim 6, wherein said fibrous material is paper.

8. The method of claim 3, wherein the ink used to create said antenna is polymerizable and comprises a silver conductive component.

9. The method of claim 3, wherein the ink used to create said antenna is polymerizable and comprises a carbon conductive component.

10. The method of claim 3, wherein the value of the capacitance of said capacitive link is taken into account in the adaptation of said antenna to said chip.

11. The method of claim 1, wherein said radiofrequency device operates in frequency ranges greater than 860 MHz.

12. The method of claim 1, wherein the electrically insulating layer is a passivating layer having a thickness in the order of 3 µm.

13. A card or label radiofrequency identification device comprising an electronic chip and an antenna equipped with two contacts, said chip comprising two conductive plates located on the last layer making up the chip, at least one of the plates being entirely covered with an electrically insulating layer, said chip being maintained in a fixed position between the contacts by means of an adhesive dielectric material and being positioned on the device so that said conductive plates are opposite the contacts and so as to create at least on capacitive link between the chip and the antenna, the link comprising the conductive plate, the electrically insulating layer entirely covering said plate and the contact.

* * * * *